United States Patent
Nagano

(10) Patent No.: US 12,275,245 B2
(45) Date of Patent: Apr. 15, 2025

(54) PIEZOELECTRIC DEVICE, LIQUID EJECTING HEAD, AND LIQUID EJECTING APPARATUS

(71) Applicant: SEIKO EPSON CORPORATION, Tokyo (JP)

(72) Inventor: Daisuke Nagano, Matsumoto (JP)

(73) Assignee: SEIKO EPSON CORPORATION (JP)

(*) Notice: Subject to any disclaimer, the term of this patent is extended or adjusted under 35 U.S.C. 154(b) by 216 days.

(21) Appl. No.: 18/185,731

(22) Filed: Mar. 17, 2023

(65) Prior Publication Data
US 2023/0294404 A1   Sep. 21, 2023

(30) Foreign Application Priority Data
Mar. 18, 2022   (JP) ................. 2022-043553

(51) Int. Cl.
*B41J 2/14*   (2006.01)
*H10N 30/20*   (2023.01)
*H10N 30/87*   (2023.01)

(52) U.S. Cl.
CPC ....... *B41J 2/14274* (2013.01); *B41J 2/14233* (2013.01); *H10N 30/2048* (2023.02); *H10N 30/87* (2023.02)

(58) Field of Classification Search
CPC ............... B41J 2/14274; B41J 2/14233; B41J 2002/14241; B41J 2002/14419; B41J 2002/14491; B41J 2202/11; H10N 30/2048; H10N 30/87; H10N 30/2047; H10N 30/708
See application file for complete search history.

(56) References Cited

FOREIGN PATENT DOCUMENTS

JP   2015-166160 A   9/2015

*Primary Examiner* — Justin Seo
*Assistant Examiner* — Tracey M McMillion
(74) *Attorney, Agent, or Firm* — Harness, Dickey & Pierce, P.L.C.

(57) ABSTRACT

A piezoelectric device includes a diaphragm provided on a side of one surface of a substrate and a piezoelectric actuator having a first electrode, a piezoelectric body layer, and a second electrode which are stacked on a side of a surface opposite to the substrate of the diaphragm, in which the piezoelectric actuator includes an active portion in which the piezoelectric body layer is pinched between the first electrode and the second electrode, and has an uneven portion constituted with a plurality of projection portions and a recess portion formed between the projection portions on a surface of the first electrode on a side of the piezoelectric body layer at an end portion of the active portion.

10 Claims, 11 Drawing Sheets

PIEZOELECTRIC DEVICE, LIQUID EJECTING HEAD, AND LIQUID EJECTING APPARATUS

The present application is based on, and claims priority from JP Application Serial Number 2022-043553, filed Mar. 18, 2022, the disclosure of which is hereby incorporated by reference herein in its entirety.

BACKGROUND

1. Technical Field

The present disclosure relates to a piezoelectric device, a liquid ejecting head, and a liquid ejecting apparatus including a diaphragm and a piezoelectric actuator having a first electrode, a piezoelectric body layer, and a second electrode.

2. Related Art

A typical example of a liquid ejecting head, which is one of the piezoelectric devices, is an ink jet recording head that ejects ink droplets. It is known that the ink jet recording head includes, for example, a flow path forming substrate in which a pressure chamber communicating with a nozzle is formed, and a piezoelectric actuator provided on the side of one surface of the flow path forming substrate via a diaphragm, and an ink droplet is ejected from a nozzle by causing a pressure change in the ink in the pressure chamber by the piezoelectric actuator.

It is known that the piezoelectric actuator includes a first electrode formed on the diaphragm, a piezoelectric body layer formed of a piezoelectric material having electromechanical conversion characteristics on the first electrode, and a second electrode provided on the piezoelectric body layer (see, for example, JP-A-2015-166160).

JP-A-2015-166160 discloses a configuration in which a plurality of piezoelectric elements as a piezoelectric actuator are provided and the plurality of piezoelectric elements are arranged side by side in a row. Each of the piezoelectric elements includes a dynamic portion (also referred to as an active portion) in which the piezoelectric body layer is pinched between the first electrode and the second electrode, and the end portion of the dynamic portion is defined by the end portion of the second electrode in a direction orthogonal to the side-by-side arrangement direction of the piezoelectric elements.

In such a configuration in which the end portion of the active portion of the piezoelectric actuator is defined by the end portion of the second electrode, there is a concern that cracks, burnout, or the like in the piezoelectric body layer caused by a strain difference from the inactive portion may occur in the vicinity of the end portion of the active portion. Specifically, minute cracks occur in the piezoelectric body layer due to bending deformation of the piezoelectric actuator, and there is a concern that burnout due to a leak current value caused by the minute cracks in the piezoelectric body layer may occur.

Such a problem is not limited to the liquid ejecting head represented by the ink jet recording head that ejects ink, and is also present in other piezoelectric devices in a similar manner.

SUMMARY

According to an aspect of the present disclosure, a piezoelectric device includes a diaphragm provided on a side of one surface of a substrate, and a piezoelectric actuator having a first electrode, a piezoelectric body layer, and a second electrode which are stacked on a side of a surface opposite to the substrate of the diaphragm, in which the piezoelectric actuator includes an active portion in which the piezoelectric body layer is pinched between the first electrode and the second electrode, and has an uneven portion constituted with a plurality of projection portions and a recess portion formed between the projection portions on a surface of the first electrode on a side of the piezoelectric body layer at an end portion of the active portion.

According to another aspect of the present disclosure, a liquid ejecting head including the piezoelectric device according to the above aspect is provided.

According to still another aspect of the present disclosure, a liquid ejecting apparatus includes the liquid ejecting head according to the above aspect.

DESCRIPTION OF EXEMPLARY EMBODIMENTS

Hereinafter, the present disclosure will be described in detail based on embodiments. However, the following description is a description in regard to one aspect of the present disclosure, and the configuration of the present disclosure can be optionally changed within the scope of the disclosure.

Further, in each figure, X, Y, and Z represent three spatial axes that are orthogonal to each other. In the present specification, the directions along these axes are the X direction, the Y direction, and the Z direction. The direction in which the arrow in each figure points is the positive (+) direction, and the opposite direction of the arrow is the negative (−) direction. Further, the Z direction indicates a vertical direction, the +Z direction indicates a vertically downward direction, and the −Z direction indicates a vertically upward direction. Further, the three X, Y, and Z spatial axes that do not limit the positive direction and the negative direction will be described as the X axis, the Y axis, and the Z axis.

First Embodiment

Figure 1:
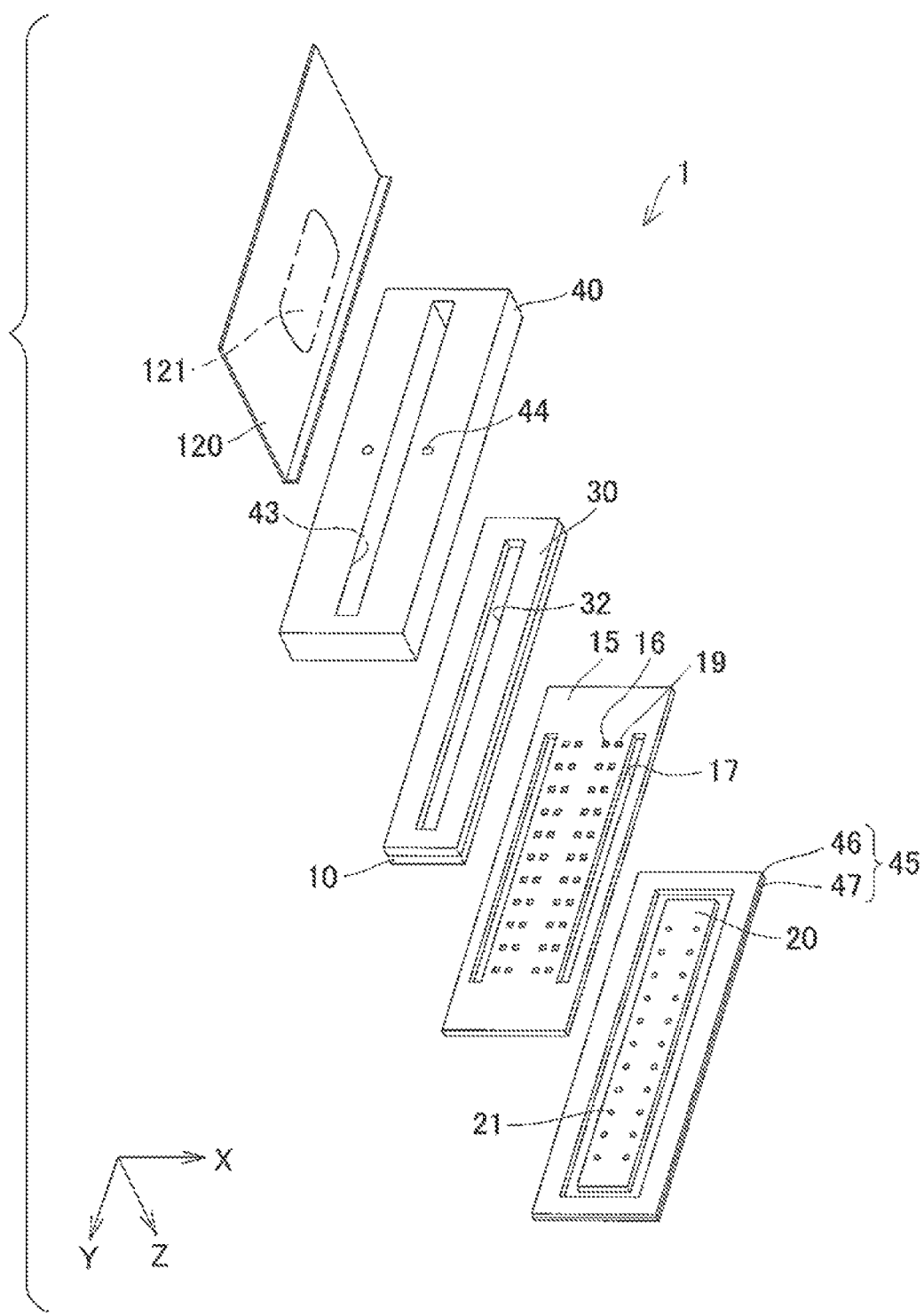
FIG. 1 is an exploded perspective view of a recording head according to a first embodiment.
Figure 2:
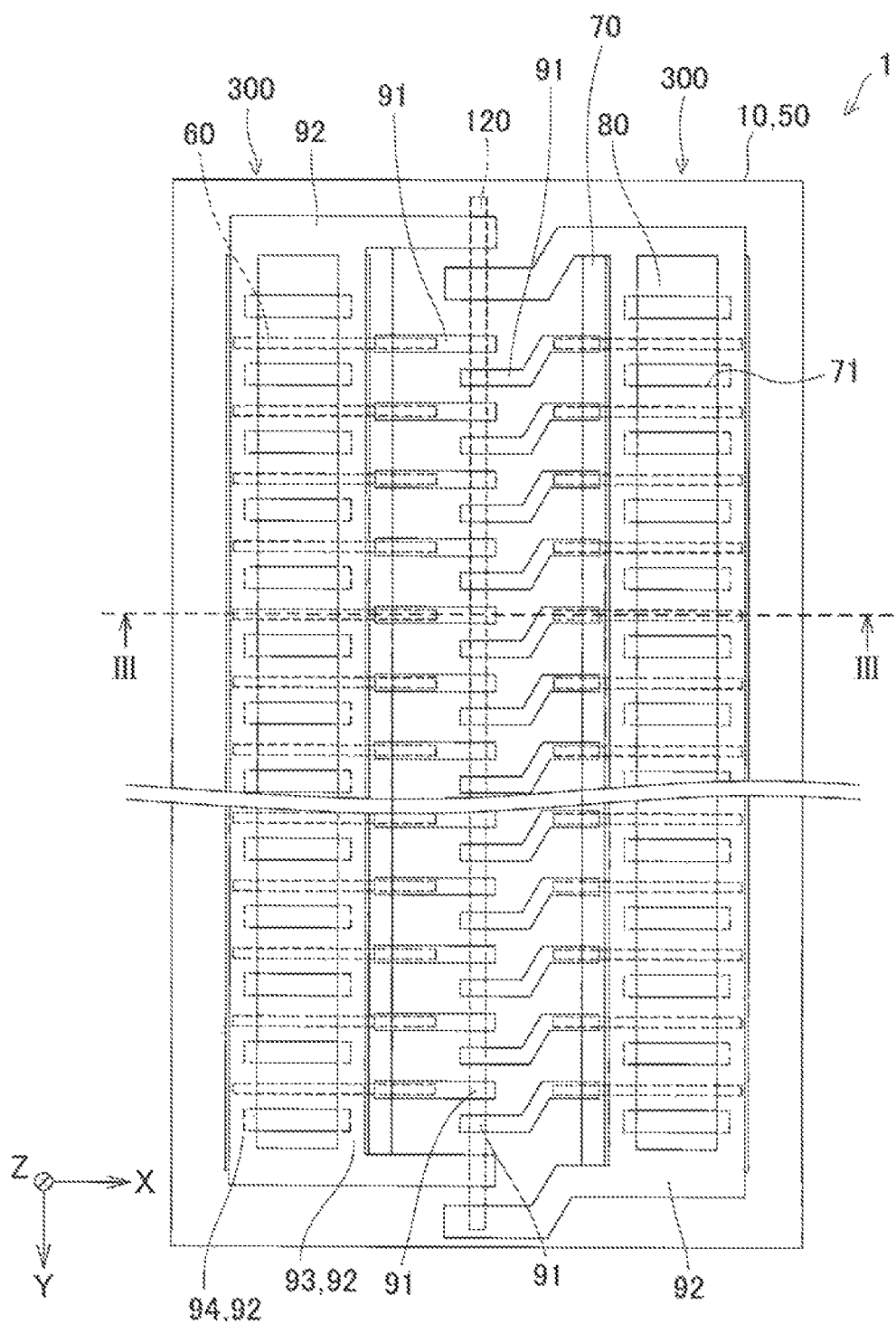
FIG. 2 is a plan view of a recording head according to the first embodiment.
Figure 3:
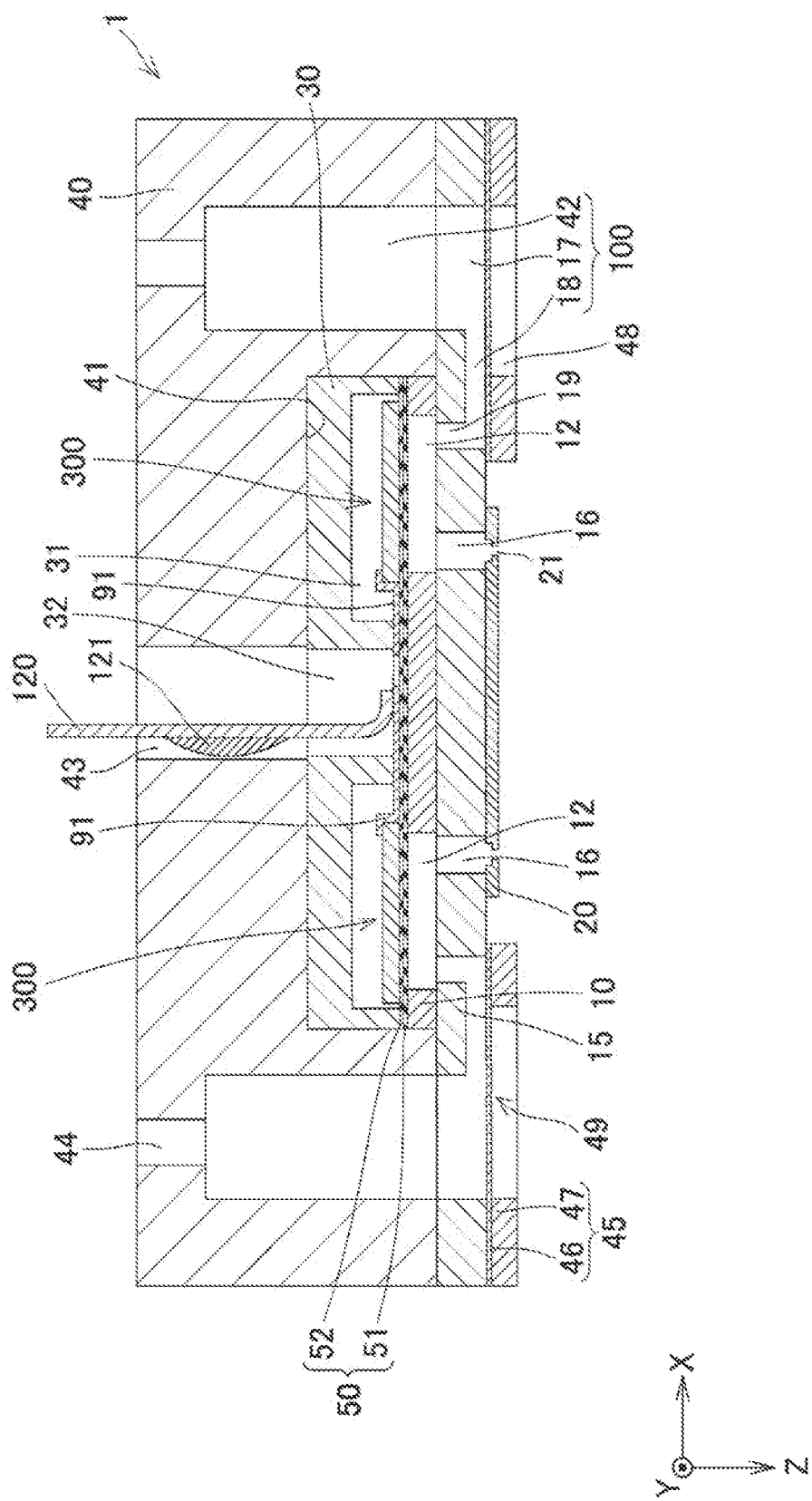
FIG. 3 is a sectional view of a recording head according to the first embodiment.
Figure 4:
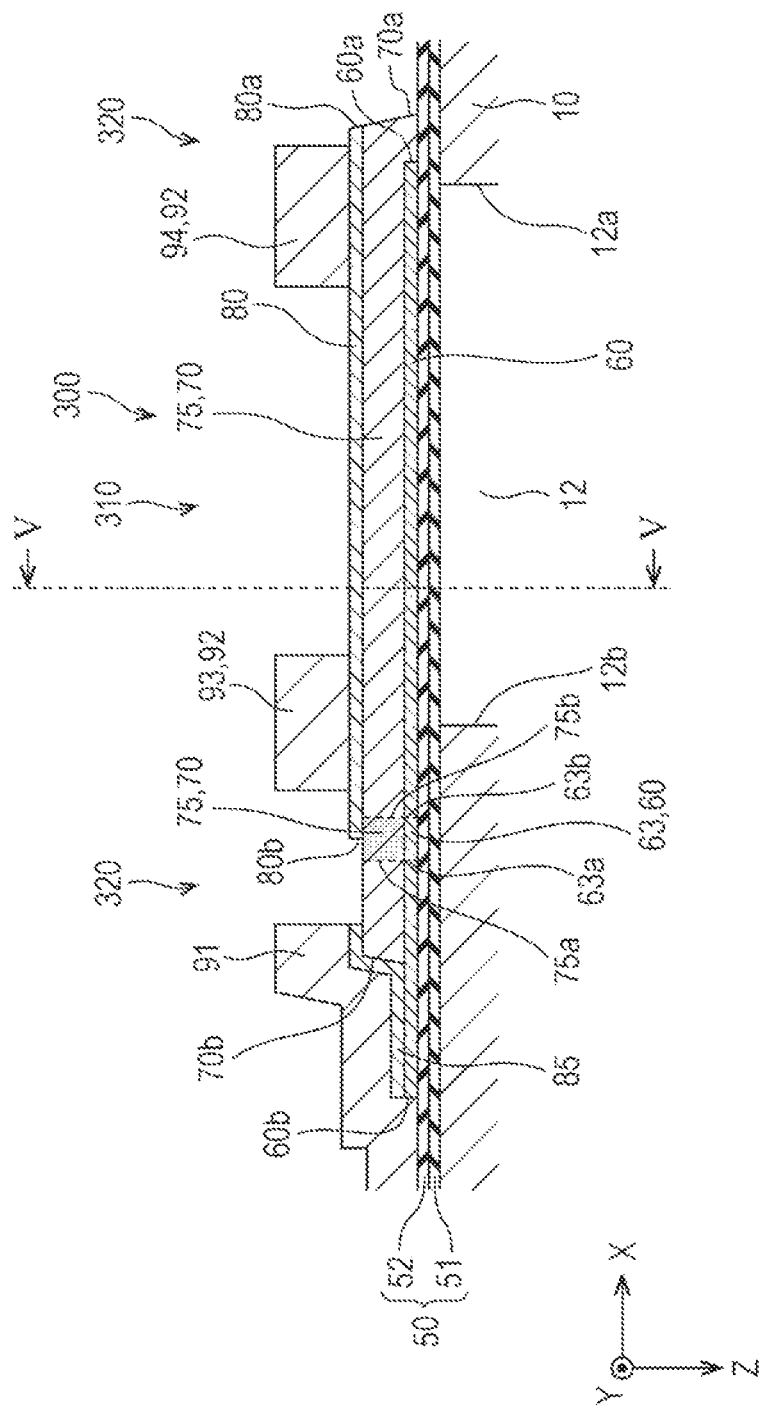
FIG. 4 is a sectional view of a piezoelectric actuator according to the first embodiment.
Figure 5:
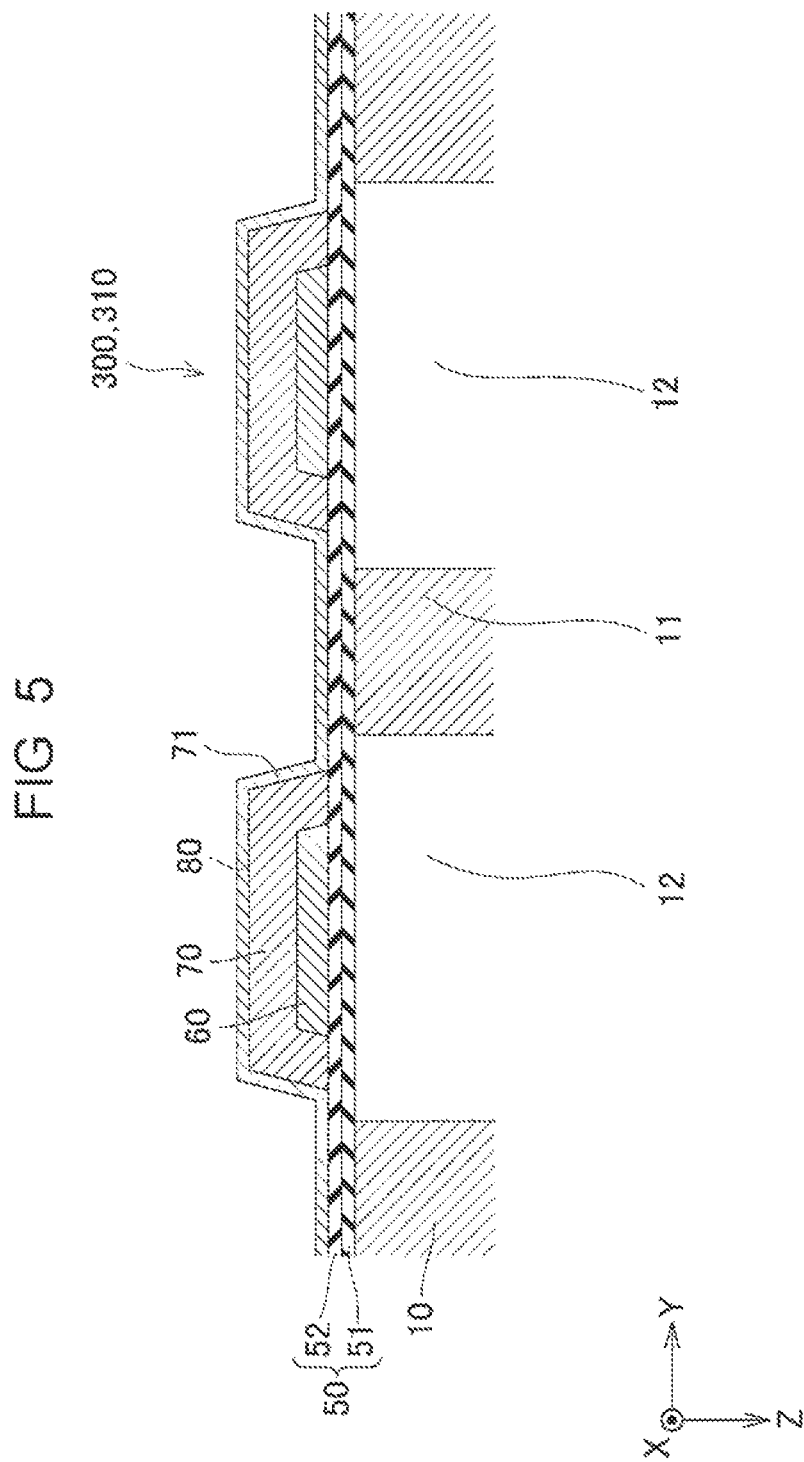
FIG. 5 is a sectional view of the piezoelectric actuator according to the first embodiment.
Figure 6:
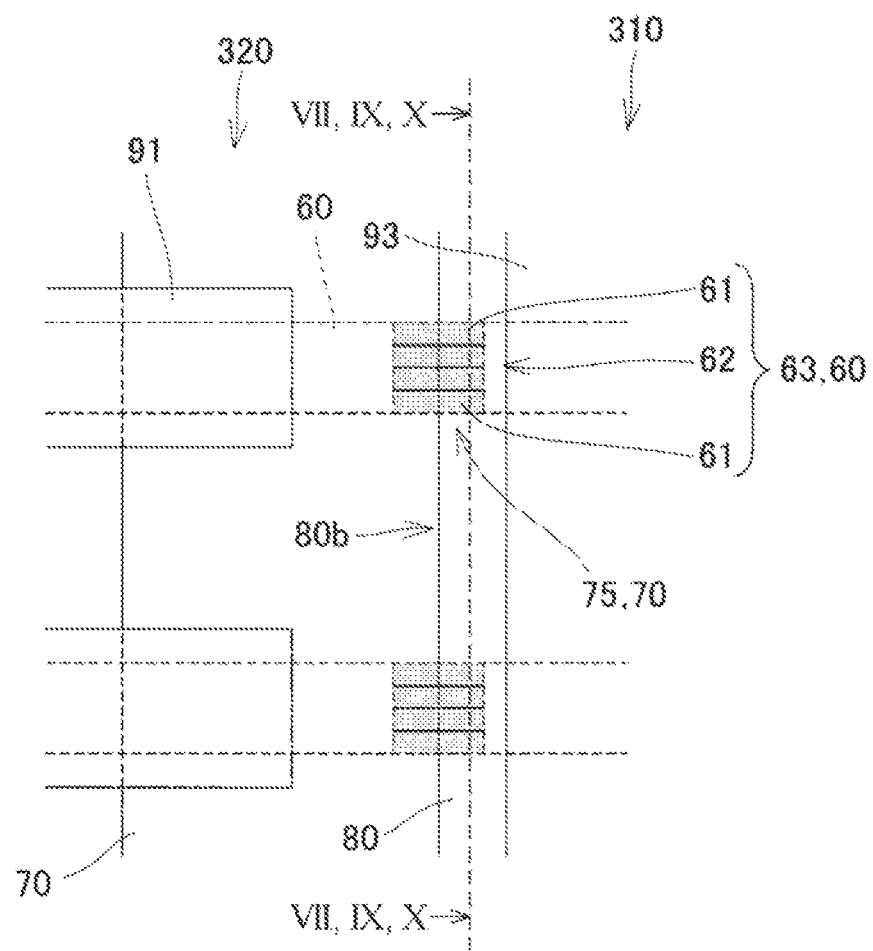
FIG. 6 is a plan view illustrating a main portion of the piezoelectric actuator according to the first embodiment.
Figure 7:
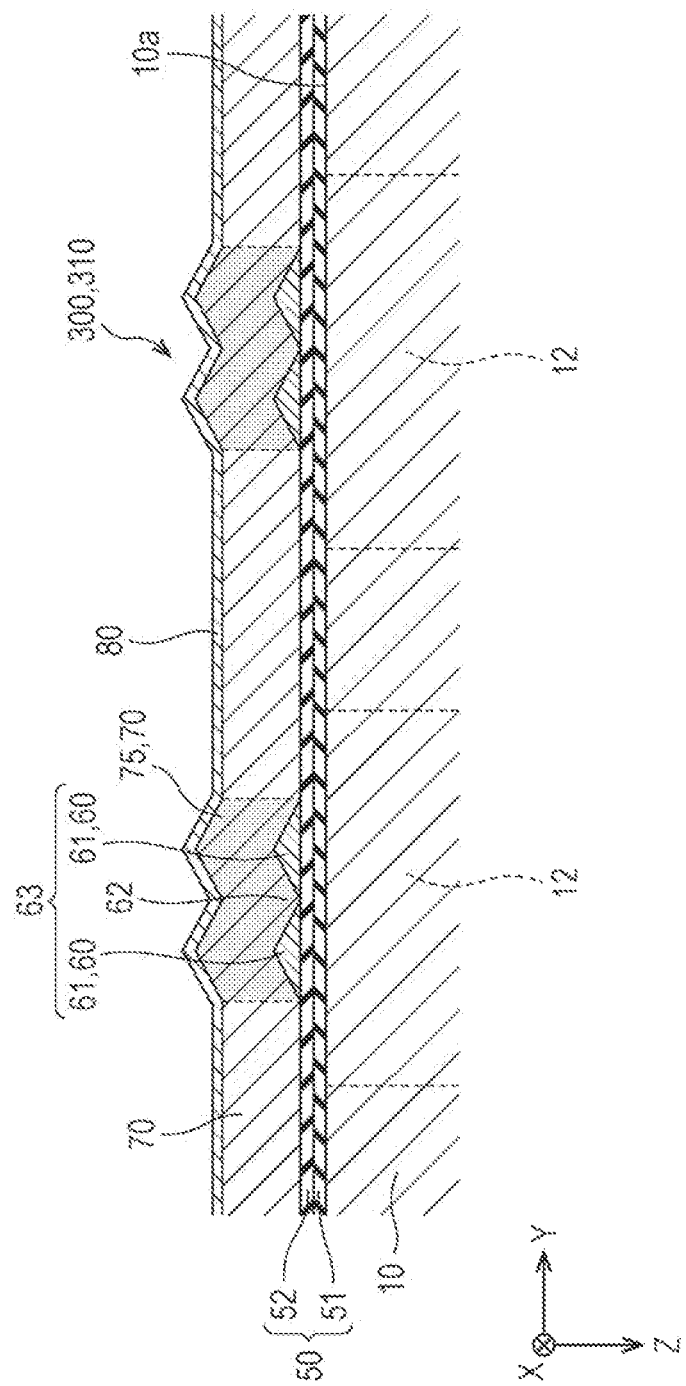
FIG. 7 is a sectional view illustrating the main portion of the piezoelectric actuator according to the first embodiment.

FIG. 1 is an exploded perspective view of an ink jet recording head which is an example of a liquid ejecting head according to a first embodiment of the present disclosure. FIG. 2 is a plan view of a recording head, and FIG. 3 is a sectional view taken along line III-III of FIG. 2. FIG. 4 is an enlarged sectional view of a portion of a piezoelectric actuator, and FIG. 5 is a sectional view taken along line V-V of FIG. 4. Further, FIG. 6 is an enlarged plan view of the vicinity of the end portion of the piezoelectric actuator, and FIG. 7 is a sectional view corresponding to line VII-VII of FIG. 6.

As illustrated in FIGS. 1 to 3, an ink jet recording head (hereinafter, also simply referred to as a recording head) 1, which is an example of the liquid ejecting head of the present embodiment, ejects ink droplets in the Z-axis direction, which is the first direction, and more specifically, in the +Z direction.

The ink jet recording head 1 includes a flow path forming substrate 10 as an example of the substrate. The flow path forming substrate 10 is made of, for example, a silicon substrate, a glass substrate, an SOI substrate, various ceramic substrates, or the like. The flow path forming substrate 10 may be a substrate with (100) plane preferential orientation or a substrate with (110) plane preferential orientation.

On the flow path forming substrate 10, a plurality of pressure chambers 12 are disposed in two rows in the X-axis direction, which is the second direction intersecting the Z-axis direction, which is the first direction. That is, the plurality of pressure chambers 12 constituting each row are disposed along the Y-axis direction, which is a third direction intersecting the X-axis direction.

The plurality of pressure chambers 12 constituting each row are disposed on a straight line along the Y-axis direction so that the positions in the X-axis direction are in the same position. The pressure chambers 12 adjacent to each other in the Y-axis direction are partitioned by a partition wall 11. Of course, the disposition of the pressure chamber 12 is not particularly limited. For example, the disposition of the plurality of pressure chambers 12 lined up in the Y-axis direction may be a so-called staggered disposition in which each of the pressure chambers 12 is positioned shifted in the X-axis direction every other pressure chamber 12.

Further, the pressure chamber 12 of the present embodiment is formed in a rectangular shape, for example, in which the length in the X-axis direction is longer than the length in the Y-axis direction in plan view from the +Z direction. Of course, the shape of the pressure chamber 12 in plan view from the +Z direction is not particularly limited, and may be a parallel quadrilateral shape, a polygonal shape, a circular shape, an oval shape, or the like. The oval shape referred to here refers to a shape in which both end portions in the longitudinal direction are semicircular shapes based on a rectangular shape, and includes a rectangular shape with rounded corners, an elliptical shape, an egg shape, or the like.

A communication plate 15, a nozzle plate 20, and a compliance substrate 45 are sequentially stacked on the side of the +Z direction of the flow path forming substrate 10.

The communication plate 15 is provided with a nozzle communication passage 16 that communicates the pressure chamber 12 and a nozzle 21. Further, the communication plate 15 is provided with a first manifold portion 17 and a second manifold portion 18 that form a portion of a manifold 100 that serves as a common liquid chamber with which the plurality of pressure chambers 12 communicate. The first manifold portion 17 is provided to penetrate the communication plate 15 in the Z-axis direction. Further, the second manifold portion 18 is provided to open on the surface on the side of the +Z direction without penetrating the communication plate 15 in the Z-axis direction.

Further, the communication plate 15 is provided with a supply communication passage 19 communicating with one end portion of the pressure chamber 12 in the X-axis direction independently of each of the pressure chambers 12. The supply communication passage 19 communicates the second manifold portion 18 with each of the pressure chambers 12, and supplies the ink in the manifold 100 to each pressure chamber 12.

As the communication plate 15, a silicon substrate, a glass substrate, an SOI substrate, various ceramic substrates, a metal substrate, or the like can be used. Examples of the metal substrate include a stainless steel substrate or the like. It is preferable that the communication plate 15 uses a material having a thermal expansion coefficient substantially the same as that of the flow path forming substrate 10. As a result, when the temperatures of the flow path forming substrate 10 and the communication plate 15 change, the warpage of the flow path forming substrate 10 and the communication plate 15 due to the difference in the thermal expansion coefficient can be suppressed.

The nozzle plate 20 is provided on the opposite side of the communication plate 15 of the flow path forming substrate 10, that is, on the surface on the side of the +Z direction. In the nozzle plate 20, the nozzle 21 is formed communicating with each of the pressure chambers 12 via the nozzle communication passage 16.

In the present embodiment, a plurality of nozzles 21 are disposed side by side to form a row along the Y-axis direction. The nozzle plate 20 is provided with two nozzle rows in the X-axis direction in which the plurality of nozzles 21 are arranged in a row. That is, the plurality of nozzles 21 in each row are disposed so that the positions in the X-axis direction are in the same position. The disposition of the nozzle 21 is not particularly limited. For example, the nozzles 21 disposed side by side in the Y-axis direction may be disposed at positions shifted in the X-axis direction every other nozzle 21.

The material of the nozzle plate 20 is not particularly limited, and for example, a silicon substrate, a glass substrate, an SOI substrate, various ceramic substrates, and a metal substrate can be used. Examples of the metal plate include a stainless steel substrate or the like. Further, as the material of the nozzle plate 20, an organic substance such as a polyimide resin can be used. However, it is preferable to use a material for the nozzle plate 20 that has substantially the same thermal expansion coefficient as the thermal expansion coefficient of the communication plate 15. As a result, when the temperatures of the nozzle plate 20 and the communication plate 15 change, the warpage of the nozzle plate 20 and the communication plate 15 due to the difference in the thermal expansion coefficient can be suppressed.

The compliance substrate 45 is provided together with the nozzle plate 20 on the opposite side of the communication plate 15 of the flow path forming substrate 10, that is, on the surface on the side of the +Z direction. The compliance substrate 45 is provided around the nozzle plate 20 and seals the openings of the first manifold portion 17 and the second manifold portion 18 provided in the communication plate 15. In the present embodiment, the compliance substrate 45 includes a sealing film 46 made of a flexible thin film and a fixed substrate 47 made of a hard material such as metal. The area of the fixed substrate 47 facing the manifold 100 is an opening portion 48 completely removed in the thickness direction. Accordingly, one surface of the manifold 100 is a compliance portion 49 sealed only by the flexible sealing film 46.

On the other hand, on the opposite side of the nozzle plate 20 or the like of the flow path forming substrate 10, that is, on the surface on the side of the −Z direction, the diaphragm 50 and a piezoelectric actuator 300 that bends and deforms the diaphragm 50 to cause a pressure change in the ink inside the pressure chamber 12, which will be described in detail later, are provided. FIG. 3 is a view for explaining the overall configuration of the recording head 1, and illustrates the piezoelectric actuator 300 in a simplified manner.

A protective substrate 30 having substantially the same size as the flow path forming substrate 10 is further bonded to the surface of the flow path forming substrate 10 on the side of the −Z direction with an adhesive or the like. The protective substrate 30 has a holding portion 31 which is a space for protecting the piezoelectric actuator 300. The holding portions 31 are independently provided for each row of the piezoelectric actuators 300 disposed side by side in the Y-axis direction, and are formed two side by side in the X-axis direction. Further, the protective substrate 30 is provided with a through hole 32 penetrating in the Z-axis direction between the two holding portions 31 disposed side by side in the X-axis direction.

Further, on the protective substrate 30, a case member 40 for defining a manifold 100 communicating with the plurality of pressure chambers 12 together with the flow path forming substrate 10 is fixed. The case member 40 has substantially the same shape as the communication plate 15 described above in plan view, and is bonded to the protective substrate 30 and also bonded to the communication plate 15 described above.

Such case member 40 has an accommodating portion 41, which is a space having a depth configured to accommodate the flow path forming substrate 10 and the protective substrate 30, on the side of the protective substrate 30. The accommodating portion 41 has an opening area wider than the surface of the protective substrate 30 bonded to the flow path forming substrate 10. The opening surface of the accommodating portion 41 on the side of the nozzle plate 20 is sealed by the communication plate 15 in a state in which the flow path forming substrate 10 and the protective substrate 30 are accommodated in the accommodating portion 41.

Further, in the case member 40, third manifold portions 42 are defined on both of the outsides of the accommodating portion 41 in the X-axis direction. The manifold 100 of the present embodiment is constituted with the first manifold portion 17 and the second manifold portion 18 provided on the communication plate 15, and the third manifold portion 42. The manifold 100 is continuously provided in the Y-axis direction, and the supply communication passages 19 that communicate each of the pressure chambers 12 and the manifold 100 are disposed side by side in the Y-axis direction.

Further, the case member 40 is provided with an introduction port 44 for communicating with the manifold 100 and supplying ink to each manifold 100. Further, the case member 40 is provided with a coupling port 43 that communicates with the through hole 32 of the protective substrate 30 and through which a wiring substrate 120 is inserted.

In such recording head 1 of the present embodiment, ink is taken in from an introduction port 44 coupled to an external ink supply unit (not illustrated), the inside from the manifold 100 to the nozzle 21 is filled with the ink, and then according to the recording signal from a drive circuit 121, a voltage is applied to each of the piezoelectric actuators 300 corresponding to the pressure chamber 12. As a result, the diaphragm 50 bends and deforms together with the piezoelectric actuator 300, the pressure inside each of the pressure chambers 12 increases, and ink droplets are ejected from each of the nozzles 21.

Hereinafter, the configuration of the piezoelectric actuator 300 according to the present embodiment will be described. As described above, the piezoelectric actuator 300 is provided on the surface of the opposite side of the nozzle plate 20 of the flow path forming substrate 10 via the diaphragm 50.

As illustrated in FIGS. 4 and 5, the diaphragm 50 is constituted with an elastic film 51, which is made of silicon oxide, provided on the side of the flow path forming substrate 10, and an insulator film 52, which is made of a zirconium oxide film, provided on the elastic film 51. The liquid flow path of the pressure chamber 12 or the like is formed by anisotropic etching of the flow path forming substrate 10 from the surface on the side of the +Z direction, and the surface of the liquid flow path of the pressure chamber 12 or the like on the side of the −Z direction is constituted with the elastic film 51.

The configuration of the diaphragm 50 is not particularly limited. The diaphragm 50 may be constituted with, for example, either the elastic film 51 or the insulator film 52, and may further include other films other than the elastic film 51 and the insulator film 52. Examples of other film materials include silicon and silicon nitride.

The piezoelectric actuator 300 is a pressure generating unit for causing a pressure change in the ink inside the pressure chamber 12, and is also called a piezoelectric element. The piezoelectric actuator 300 includes a first electrode 60, a piezoelectric body layer 70, and a second electrode 80 that are sequentially stacked from the side of the +Z direction, which is the side of the diaphragm 50, to the side of the −Z direction.

In the piezoelectric actuator 300, a portion in which piezoelectric strain occurs in the piezoelectric body layer 70 when a voltage is applied between the first electrode 60 and the second electrode 80 is referred to as an active portion 310. On the other hand, a portion where the piezoelectric strain does not occur in the piezoelectric body layer 70 is referred to as an inactive portion 320. That is, in the piezoelectric actuator 300, the portion in which the piezoelectric body layer 70 is pinched between the first electrode 60 and the second electrode 80 is the active portion 310, and the portion in which the piezoelectric body layer 70 is not pinched between the first electrode 60 and the second electrode 80 is the inactive portion 320.

Further, when the piezoelectric actuator 300 is driven, a portion that is actually displaced in the Z-axis direction is referred to as a flexible portion, and a portion that is not displaced in the Z-axis direction is referred to as a non-flexible portion. That is, in the active portion 310 of the piezoelectric actuator 300, a portion that faces the pressure chamber 12 in the Z-axis direction is a flexible portion, and the outside portion of the pressure chamber 12 is a non-flexible portion.

Generally, one electrode of the active portion 310 is configured as an independent individual electrode for each piezoelectric actuator 300, and the other electrode is configured as a common electrode common to a plurality of piezoelectric actuators 300. In the present embodiment, the first electrode 60 is configured as an individual electrode, and the second electrode 80 is configured as a common electrode.

Specifically, the first electrode 60 constitutes an individual electrode that is separated for each pressure chamber 12 and is independent for each active portion 310. The first electrode 60 is formed to have a width narrower than the width of the pressure chamber 12 in the Y-axis direction. That is, the end portion of the first electrode 60 is positioned on the inside of the area facing the pressure chamber 12, in the Y-axis direction.

In the X-axis direction, the first electrode 60 extends from an area facing the pressure chamber 12 to the outside of the pressure chamber 12, and each of an end portion 60a in the +X direction and an end portion 60b in the −X direction of the first electrode 60 in FIG. 4 is disposed on the outside of the pressure chamber 12. Further, the end portion 60a of the first electrode 60 in the +X direction is disposed at a position further in the +X direction compared to the end portion 12a of the pressure chamber 12 in the +X direction, and the end portion 60b of the first electrode 60 in the −X direction is disposed at a position further in the −X direction compared to the end portion 12b of the pressure chamber 12 in the −X direction.

The material of the first electrode 60 is not particularly limited, but for example, a conductive material such as a metal such as iridium or platinum or a conductive metal oxide such as indium tin oxide abbreviated as ITO, is used.

The piezoelectric body layer 70 is continuously provided along the Y-axis direction with a length in the X-axis direction as a predetermined length. That is, the piezoelectric body layer 70 has a predetermined thickness and is continuously provided along the side-by-side arrangement direction of the pressure chambers 12. The thickness of the piezoelectric body layer 70 is not particularly limited, but is formed to have a thickness of approximately 1 to 4 μm.

Further, the length of the piezoelectric body layer 70 in the X-axis direction is longer than the length in the X-axis direction which is the longitudinal direction of the pressure chamber 12, and the piezoelectric body layer 70 extends to both of the outsides of the pressure chamber 12 in the X-axis direction. Further, an end portion 70a of the piezoelectric body layer 70 in the +X direction in FIG. 4 is positioned more outside compared to the end portion 60a of the first electrode 60 in the +X direction. That is, the end portion 60a of the first electrode 60 is covered with the piezoelectric body layer 70. On the other hand, the end portion 70b of the piezoelectric body layer 70 in the −X direction is positioned more inside compared to an end portion 60b of the first electrode 60 in the −X direction, and the end portion 60b of the first electrode 60 is not covered by the piezoelectric body layer 70.

As illustrated in FIG. 5, in the piezoelectric body layer 70, a groove portion 71 having a thickness thinner than the other areas is formed at a position corresponding to each of the partition walls 11. The groove portion 71 of the present embodiment is formed by completely removing the piezoelectric body layer 70 in the Z-axis direction. That is, the fact that the piezoelectric body layer 70 has a portion having a thickness thinner than the other areas includes the one in which the piezoelectric body layer 70 is completely removed in the Z-axis direction. Of course, the piezoelectric body layer 70 may remain thinner than the other portions on the bottom surface of the groove portion 71.

By providing the groove portion 71 in the piezoelectric body layer 70, the rigidity of the portion of the diaphragm 50 facing the end portion of the pressure chamber 12 in the Y-axis direction, that is, the so-called arm portion of the diaphragm 50 is suppressed, and thus the piezoelectric actuator 300 can be displaced more satisfactorily.

Examples of the piezoelectric body layer 70 include a perovskite-structured crystal film (perovskite-type crystal) formed on the first electrode 60 and made of a ferroelectric ceramic material exhibiting an electromechanical conversion action. As the material of the piezoelectric body layer 70, for example, a ferroelectric piezoelectric material such as lead zirconate titanate (PZT) or a material obtained by adding a metal oxide such as niobium oxide, nickel oxide, or magnesium oxide, or the like thereto, can be used. Specifically, lead titanate ($PbTIO_3$), lead zirconate titanate ($Pb(Zr, Ti)O_3$), lead zirconate ($PbZrO_3$), lead lanthanum titanate ($(Pb,La)TiO_3$), lead lanthanum zirconate titanate ($(Pb,La)(Zr,Ti)O_3$) or lead magnesium niobate zirconium titanate ($Pb(Zr,Ti)(Mg,Nb)O_3$), or the like, can be used. In the present embodiment, lead zirconate titanate (PZT) is used as the piezoelectric body layer 70.

Further, the material of the piezoelectric body layer 70 is not limited to the lead-based piezoelectric material containing lead, and a lead-free piezoelectric material containing no lead can also be used. Examples of lead-free piezoelectric materials include bismuth iron acid (($BiFeO_3$), abbreviated as "BFO"), barium titanate (($BaTIO_3$), abbreviated as "BT"), potassium sodium niobate (($K,Na)(NbO_3$), abbreviated as "KNN"), potassium sodium lithium niobate (($K,Na,Li)(NbO_3$)), potassium sodium lithium niobate tantalate (($K,Na,Li)(Nb,Ta)O_3$), bismuth potassium titanate (($Bi_{1/2}K_{1/2})TiO_3$, abbreviated as "BKT"), bismuth sodium titanate (($Bi_{1/2}Na_{1/2})TiO_3$, abbreviated as "BNT"), bismuth manganate ($BimnO_3$, abbreviated as "BM"), a complex oxide containing bismuth, potassium, titanium, and iron and having a perovskite structure ($x[(Bi_xK_{1-x})TiO_3]$-$(1-x)[BiFeO_3]$, abbreviated as "BKT-BF"), a complex oxide containing bismuth, iron, barium and titanium and having a perovskite structure (($1-x)[BiFeO_3]$-$x[BaTIO_3]$, abbreviated as "BFO-BT") or a complex oxide added with a metal such as manganese, cobalt, and chromium (($1-x)[Bi(Fe_{1-y}M_y)O_3]$-$x[BaTIO_3]$ (M is Mn, Co or Cr)), or the like.

The second electrode 80 is provided on the side of the −Z direction which is the opposite side of the first electrode 60 of the piezoelectric body layer 70, and is configured as a common electrode common to the plurality of active portions 310. The second electrode 80 is continuously provided in the Y-axis direction with a length in the X-axis direction as a predetermined length. The second electrode 80 is also provided on the inner surface of the groove portion 71, that is, on the side surface of the groove portion 71 of the piezoelectric body layer 70, and on the insulator film 52 which is the bottom surface of the groove portion 71. Inside of the groove portion 71, the second electrode 80 may be provided only on a portion of the inner surface of the groove portion 71, or may not be provided over the entire surface of the inner surface of the groove portion 71.

Further, in FIG. 4, an end portion 80a of the second electrode 80 in the +X direction is disposed more outside compared to the end portion 60a of the first electrode 60 covered with the piezoelectric body layer 70. That is, the end portion 80a of the second electrode 80 is positioned more outside compared to the end portion 12a of the pressure chamber 12 in the +X direction, and more outside compared to the end portion 60a of the first electrode 60. Accordingly, the end portion of the active portion 310 on the side of the +X direction, that is, the boundary between the active portion 310 and the inactive portion 320 is defined by the end portion 60a of the first electrode 60.

On the other hand, in FIG. 4, the end portion 80b of the second electrode 80 in the −X direction is disposed more outside compared to the end portion 12b of the pressure chamber 12 in the −X direction, but is disposed more inside compared to the end portion 70b of the piezoelectric body layer 70 in the −X direction. As described above, the end portion 70b of the piezoelectric body layer 70 is positioned more inside compared to the end portion 60b of the first electrode 60. Accordingly, the end portion 80b of the second electrode 80 is positioned on the piezoelectric body layer 70 more inside compared to the end portion 60b of the first electrode 60. Accordingly, there is present a portion in which the surface of the piezoelectric body layer 70 is exposed on the outside of the end portion 80b of the second electrode 80.

As described above, since the end portion 80b of the second electrode 80 is disposed further in the +X direction compared to the end portions 60b and 70b of the piezoelectric body layer 70 and the first electrode 60 in the −X direction, the end portion of the active portion 310 in the −X direction, that is, the boundary between the active portion 310 and the inactive portion 320 is defined by the end portion 80b of the second electrode 80.

The material of the second electrode 80 is not particularly limited, but similarly to the first electrode 60, for example, a conductive material such as a metal such as iridium or platinum or a conductive metal oxide such as indium tin oxide, is preferably used.

Further, on the outside of the end portion 80b of the second electrode 80, that is, further in the −X direction of the end portion 80b of the second electrode 80, a wiring portion 85 that is formed of the same layer as the second electrode 80 but is electrically discontinuous with the second electrode 80, is provided. The wiring portion 85 is formed over from the top of the piezoelectric body layer 70 to the top of the first electrode 60 extending further in the −X direction than the piezoelectric body layer 70 in a state in which an interval is spaced not to be in contact with the end portion 80b of the second electrode 80. The wiring portion 85 is provided independently for each of the active portions 310. That is, a plurality of wiring portions 85 are disposed at a predetermined interval along the Y-axis direction. The wiring portion 85 may be formed of a layer different from that of the second electrode 80, but is preferably formed of the same layer as the second electrode 80. As a result, the manufacturing step of the wiring portion 85 can be simplified and the cost can be reduced.

Further, as illustrated in FIGS. 2 and 3, an individual lead electrode 91 and a common lead electrode 92, which is a common driving electrode, are coupled to the first electrode 60 and the second electrode 80 that constitute the piezoelectric actuator 300, respectively. The flexible wiring substrate 120 is coupled to an end portion on the opposite side of the end portions of the individual lead electrode 91 and the common lead electrode 92, the end portions coupled to the piezoelectric actuator 300. In the present embodiment, the individual lead electrode 91 and the common lead electrode 92 are extended to be exposed in the through hole 32 formed in the protective substrate 30, and are electrically coupled to the wiring substrate 120 in the through hole 32. A drive circuit 121 having a switching element for driving the piezoelectric actuator 300 is mounted on the wiring substrate 120.

In the present embodiment, the individual lead electrode 91 and the common lead electrode 92 are made of the same layer, but are formed to be electrically discontinuous. As a result, the manufacturing step can be simplified and the cost can be reduced as compared to when the individual lead electrode 91 and the common lead electrode 92 are individually formed. Of course, the individual lead electrode 91 and the common lead electrode 92 may be formed of different layers.

The material of the individual lead electrode 91 and the common lead electrode 92 is not particularly limited as long as it is a conductive material, and for example, gold (Au), platinum (Pt), aluminum (Al), copper (Cu) or the like can be used. In the present embodiment, gold (Au) is used as the individual lead electrode 91 and the common lead electrode 92. Further, the individual lead electrode 91 and the common lead electrode 92 may have an adhesion layer made of nickel chromium (NiCr) or the like for improving the adhesion with the first electrode 60, the second electrode 80, and the diaphragm 50.

The individual lead electrode 91 is provided for each active portion 310, that is, for each first electrode 60. The individual lead electrode 91 is coupled to the vicinity of the end portion 60b of the first electrode 60 in the −X direction provided on the outside of the piezoelectric body layer 70 via the wiring portion 85, and is drawn out on the top of the flow path forming substrate 10, actually to the top of the diaphragm 50 in the X-axis direction.

On the other hand, the common lead electrode 92 is drawn out in the X-axis direction from the top of the second electrode 80 constituting the common electrode on the piezoelectric body layer 70 to the top of the diaphragm 50, at both end portions in the Y-axis direction. Further, the common lead electrode 92 has an extension portion 93 extending along the Y-axis direction in an area corresponding to the end portion of the pressure chamber 12 in the X-axis direction. Further, the common lead electrode 92 includes an extension portion 94 extending along the Y-axis direction in an area corresponding to the other end portion of the pressure chamber 12 on the X-axis direction. The extension portions 93 and 94 are continuously provided along the Y-axis direction with respect to the plurality of active portions 310.

Further, the extension portions 93 and 94 extend from the inside of the pressure chamber 12 to the outside of the pressure chamber 12 in the X-axis direction. In the present embodiment, the active portions 310 of the piezoelectric actuator 300 extend to the outside of the pressure chamber 12 at both end portions of the pressure chamber 12 in the X-axis direction, and the extension portions 93 and 94 extend from the inside of the pressure chamber 12 to the outside thereof on the top of the active portion 310 (see FIG. 4).

By the way, at the end portion of the active portion 310 of such a piezoelectric actuator 300 in the X-axis direction, an uneven portion 63 constituted with a projection portion 61 and a recess portion 62 formed between a plurality of the projection portions 61 is provided on the surface of the first electrode 60 on the side of the piezoelectric body layer 70, as illustrated in FIGS. 6 and 7. In the present embodiment, the uneven portion 63 constituted with the two projection portions 61 arranged side by side in the Y-axis direction and the one recess portion 62 formed between the two projection portions 61 is provided on the surface of the first electrode 60. Each of the projection portions 61 is formed in a continuous linear shape along the X-axis direction, which is the pull-out direction of the first electrode 60. As a result, the recess portion 62 is also formed in a continuous linear shape along the X-axis direction, which is the pull-out direction of the first electrode 60.

The number of the projection portions 61 and the recess portions 62 constituting the uneven portion 63 is not particularly limited, and for example, the uneven portion 63 may be configured to include the three or more projection portions 61. For example, the uneven portion 63 may be constituted with the five projection portions 61 and the four recess portions 62 formed between the five projection portions 61.

Further, the uneven portion 63 is formed of the same metal material as the first electrode 60. In the present embodiment, the uneven portion 63 is formed on the first electrode 60 itself. The first electrode 60 is formed by forming a film on the entire surface of the flow path forming substrate 10 on the insulator film 52 and then patterning the film into a predetermined shape, and at this time, for example, the uneven portion 63 is formed on the surface of the first electrode 60 by performing a dry etching process such as laser processing or ion milling. Of course, the method of forming the uneven portion 63 on the surface of the first electrode 60 is not particularly limited.

Each of the projection portions 61 constituting the uneven portion 63 is formed in a chevron shape, and as illustrated in FIG. 7, the cross section thereof is substantially triangular. Therefore, the surface of each of the projection portions 61 is an inclined surface that is inclined with respect to a surface 10a of the flow path forming substrate 10. The recess portion 62 formed between the projection portions 61 is formed to have a depth approximately similar to the thickness of the first electrode 60, but is formed without penetrating the first electrode 60 in the Z-axis direction, which is the thickness direction. Accordingly, the surface (inner surface) of the recess portion 62 is also an inclined surface. That is, the first electrode 60 is continuously provided even in the Y-axis direction.

The piezoelectric body layer 70 is formed on the first electrode 60 including such uneven portion 63 with a substantially constant thickness. Accordingly, the surface of the piezoelectric body layer 70 of the portion corresponding to the uneven portion 63 has an uneven shape that follows the surface shape of the uneven portion 63. Similarly, the surface of the second electrode 80 of the portion corresponding to the uneven portion 63 also has an uneven shape along the surface of the uneven portion 63.

Here, the piezoelectric body layer 70 formed on the uneven portion 63 of the first electrode 60 has a lower orientation ratio than the piezoelectric body layer 70 formed on a portion other than the uneven portion 63 of the first electrode 60. As described above, the surfaces of the projection portion 61 and the recess portion 62 constituting the uneven portion 63 are inclined surfaces. The piezoelectric body layer 70 formed on such an inclined surface of the first electrode 60 has a lower orientation ratio than the piezoelectric body layer 70 formed on a flat surface of the first electrode 60 parallel to the surface 10a of the flow path forming substrate 10, due to the influence of a base, which is an inclined surface, or the like. That is, the piezoelectric body layer 70 formed on the uneven portion 63 of the first electrode 60 has a lower orientation ratio than the piezoelectric body layer 70 formed on a portion other than the uneven portion 63 of the first electrode 60.

In the present embodiment, the piezoelectric body layer 70 formed on the first electrode 60 basically has (100) plane preferential orientation, but the (100) plane orientation ratio of the piezoelectric body layer 70 formed on the uneven portion 63 is lower than the (100) plane orientation ratio of the piezoelectric body layer 70 formed in a portion other than the uneven portion 63.

That is, the piezoelectric body layer 70 formed on the first electrode 60 is basically in (100) plane preferential orientation, but the uneven portion 63 is formed in a portion of the piezoelectric body layer 70 corresponding to the end portion of the active portion 310, such that a low orientation portion 75 that has a (100) plane orientation ratio lower than that of the other portions is formed.

In addition, "having preferential orientation" means that 50% or more, preferably 80% or more of crystals are oriented to a predetermined crystal plane. For example, "having (100) plane preferential orientation" includes not only when all the crystals are (100) plane-oriented, but also when more than half of the crystals (in other words, 50% or more, preferably 80% or more) are (100) plane-oriented. Further, the low orientation portion 75 of the piezoelectric body layer 70 may have a (100) plane orientation ratio lower than that of the other portions, and of course may have (100) plane orientation, but may not have (100) plane orientation.

The piezoelectric body layer 70 formed on the uneven portion 63 of the first electrode 60, that is, the low orientation portion 75 having the (100) plane orientation ratio lower than that of the other portions, is subjected to piezoelectric strain that is appropriately smaller than that of the other portions of the active portion 310 when a voltage is applied to the piezoelectric actuator 300. Accordingly, at the end portion of the active portion 310 in which the uneven portion 63 is provided on the first electrode 60, the deformation of the piezoelectric actuator 300 is suppressed to be appropriately smaller than that of the other portions.

As a result, at the end portion of the active portion 310, that is, at the boundary portion between the active portion 310 and the inactive portion 320, it is possible to suppress the occurrence of the minute cracks in the piezoelectric body layer 70 due to bending deformation of the piezoelectric actuator 300. Therefore, it is possible to suppress the occurrence of burnout due to the leak current caused by the minute cracks in the piezoelectric body layer 70. That is, at the end portion of the active portion 310, it is possible to suppress the occurrence of cracks, burnout, or the like of the piezoelectric body layer 70 caused by the strain difference from the inactive portion 320.

As described above, the piezoelectric device according to the present disclosure includes a diaphragm provided on a side of one surface of a substrate, and a piezoelectric actuator having a first electrode, a piezoelectric body layer, and a second electrode which are stacked on a side of a surface opposite to the substrate of the diaphragm, in which the piezoelectric actuator includes an active portion in which the piezoelectric body layer is pinched between the first electrode and the second electrode, and has an uneven portion constituted with a plurality of projection portions and a recess portion formed between the projection portions on a surface of the first electrode on a side of the piezoelectric body layer at an end portion of the active portion.

As a result, at the end portion of the active portion 310, that is, at the boundary portion between the active portion 310 and the inactive portion 320, it is possible to suppress the occurrence of the minute cracks in the piezoelectric body layer 70 due to bending deformation of the piezoelectric actuator 300. Therefore, it is possible to suppress the occurrence of burnout due to the leak current caused by the minute cracks in the piezoelectric body layer 70.

Here, it is preferable that the uneven portion 63 is formed in a portion of the active portion 310 of the piezoelectric actuator 300, which is a non-flexible portion, that is, a portion that extends to the outside of the pressure chamber 12 in as wide a range as possible. In other words, it is preferable that the low orientation portion 75 of the piezoelectric body layer 70 is formed in a portion of the active portion 310 of the piezoelectric actuator 300, which is a non-flexible portion, in as wide a range as possible. As a result, it becomes easier to suppress the occurrence of cracks and burnout in the piezoelectric body layer 70.

Further, it is preferable that the projection portion 61 and the recess portion 62 constituting the uneven portion 63 are formed in a linear shape along the pull-out direction of the first electrode 60. By forming the projection portion 61 and the recess portion 62 in such a shape, the uneven portion 63 can be relatively easily formed by patterning the surface of the first electrode 60. Further, although the uneven portion 63 is formed on the first electrode 60 itself, since the first electrode 60 is electrically continuous via the uneven portion 63, it becomes easy to secure the function as the first electrode 60.

Further, it is preferable that the uneven portion 63 is formed of the same metal material as the first electrode 60. In the present embodiment, the uneven portion 63 is formed on the first electrode 60 itself. As a result, after forming the first electrode 60 into a film, the uneven portion 63 can be relatively easily formed by patterning. The uneven portion 63 may be formed in a layer different from that of the first electrode 60. For example, an additional layer made of the same metal material as the first electrode 60 may be formed on the side of the piezoelectric body layer 70 of the first electrode 60, and the uneven portion 63 may be formed by patterning the additional layer.

Further, it is preferable that the uneven portion 63 is continuously provided from the active portion 310 to the inactive portion 320 of the piezoelectric actuator 300 as in the present embodiment. For example, in FIG. 4, it is preferable that the end portion 63a of the uneven portion 63 on the side of the −X direction is positioned more outside compared to the end portion 80b of the second electrode 80 on the side of the −X direction. That is, in FIG. 4, it is preferable that the end portion 75a of the low orientation portion 75 of the piezoelectric body layer 70 on the side of the −X direction is positioned more outside compared to the end portion 80b of the second electrode 80.

The end portion 80b of the second electrode 80 defines a boundary between the active portion 310 in which piezoelectric strain occurs and the inactive portion 320 in which piezoelectric strain does not occur, when a voltage is applied. Accordingly, in the vicinity of the end portion 80b of the second electrode 80, minute cracks are likely to occur in the piezoelectric body layer 70 when a voltage is applied.

However, the uneven portion 63 is continuously provided from the active portion 310 to the inactive portion 320, that is, the uneven portion 63 extends to the outside of the end portion 80b of the second electrode 80, such that the piezoelectric strain at the boundary between the active portion 310 and the inactive portion 320 is suppressed to be appropriately small. Therefore, it becomes easier to suppress the occurrence of cracks in the piezoelectric body layer 70 in the vicinity of the end portion of the active portion 310.

Figure 8:
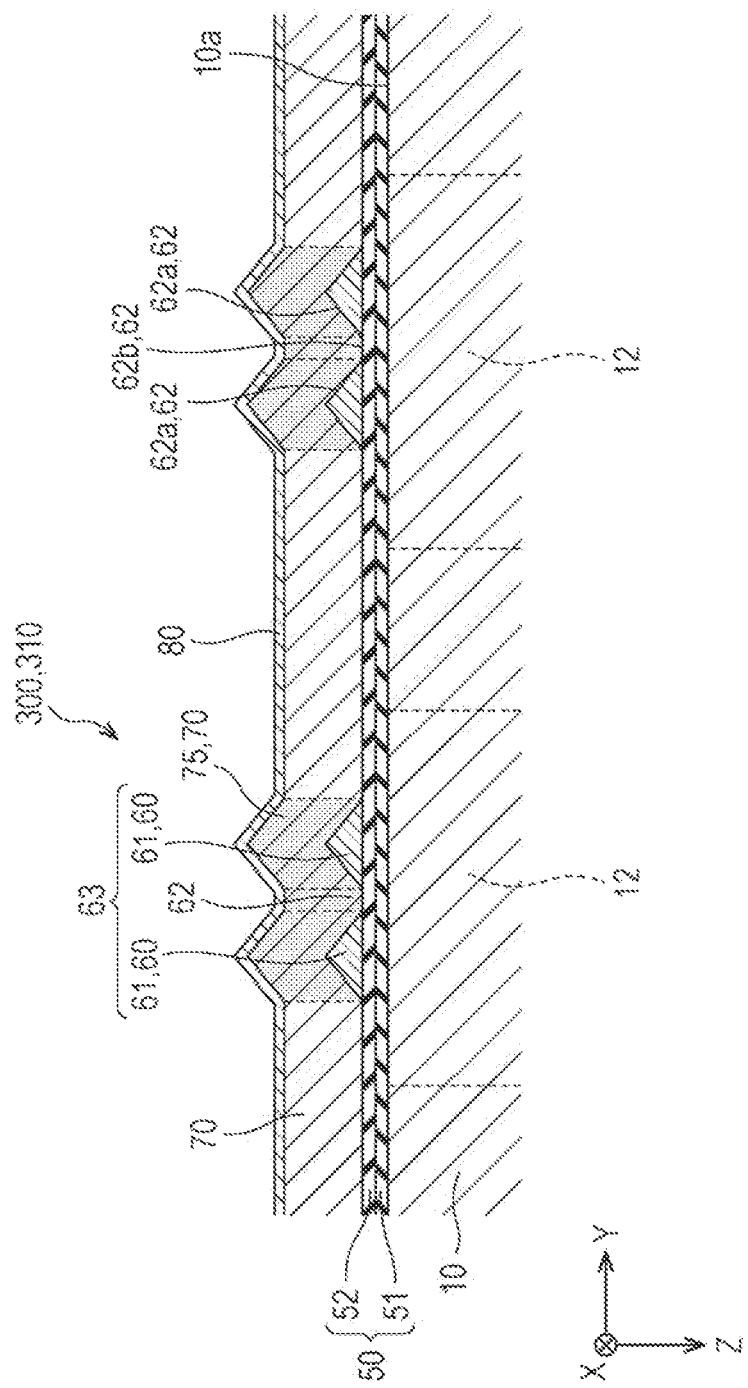
FIG. 8 is a sectional view illustrating a modification example of the piezoelectric actuator according to the first embodiment.

Further, the shape of the uneven portion 63 is not particularly limited. In the present embodiment, the projection portions 61 are continuously formed along the Y-axis direction, and for example, as illustrated in FIG. 8, each of the projection portions 61 may be provided with a gap. In other words, each of the recess portions 62 may be provided to penetrate the first electrode 60 in the thickness direction. The surface of each of the recess portions 62 may be an inclined surface that is inclined with respect to the surface 10a of the flow path forming substrate 10, and may be formed with a side surface portion 62a constituted with the first electrode 60 and a bottom surface portion 62b constituted with the insulator film 52.

In the example of FIG. 8, the bottom surface portion 62b of the recess portion 62 is a flat surface substantially parallel to the surface 10a of the flow path forming substrate 10. However, the bottom surface portion 62b is constituted with the insulator film 52 as described above. Accordingly, the orientation ratio of the piezoelectric body layer 70 formed on the bottom surface portion 62b is lower than the orientation ratio of the piezoelectric body layer 70 formed on a portion other than the uneven portion 63, in a similar manner as the orientation ratio of the piezoelectric body layer 70 formed on the side surface portion 62a. That is, even in the configuration, the piezoelectric body layer 70 formed on the uneven portion 63 is the low orientation portion 75 having a lower orientation ratio than the other portions.

Therefore, even in such a configuration, it is possible to suppress the occurrence of minute cracks in the piezoelectric body layer 70 due to bending deformation of the piezoelectric actuator 300 at the end portion of the active portion 310. Therefore, it is possible to suppress the occurrence of burnout due to the leak current caused by the minute cracks in the piezoelectric body layer 70.

Further, since the recess portion 62 is provided to penetrate the first electrode 60, the product inspection when the uneven portion 63 is formed becomes easy. That is, since the insulator film 52 is exposed in the recess portion 62, it becomes easy to determine whether or not the recess portion 62 is appropriately formed in the product inspection.

Second Embodiment

Figure 9:
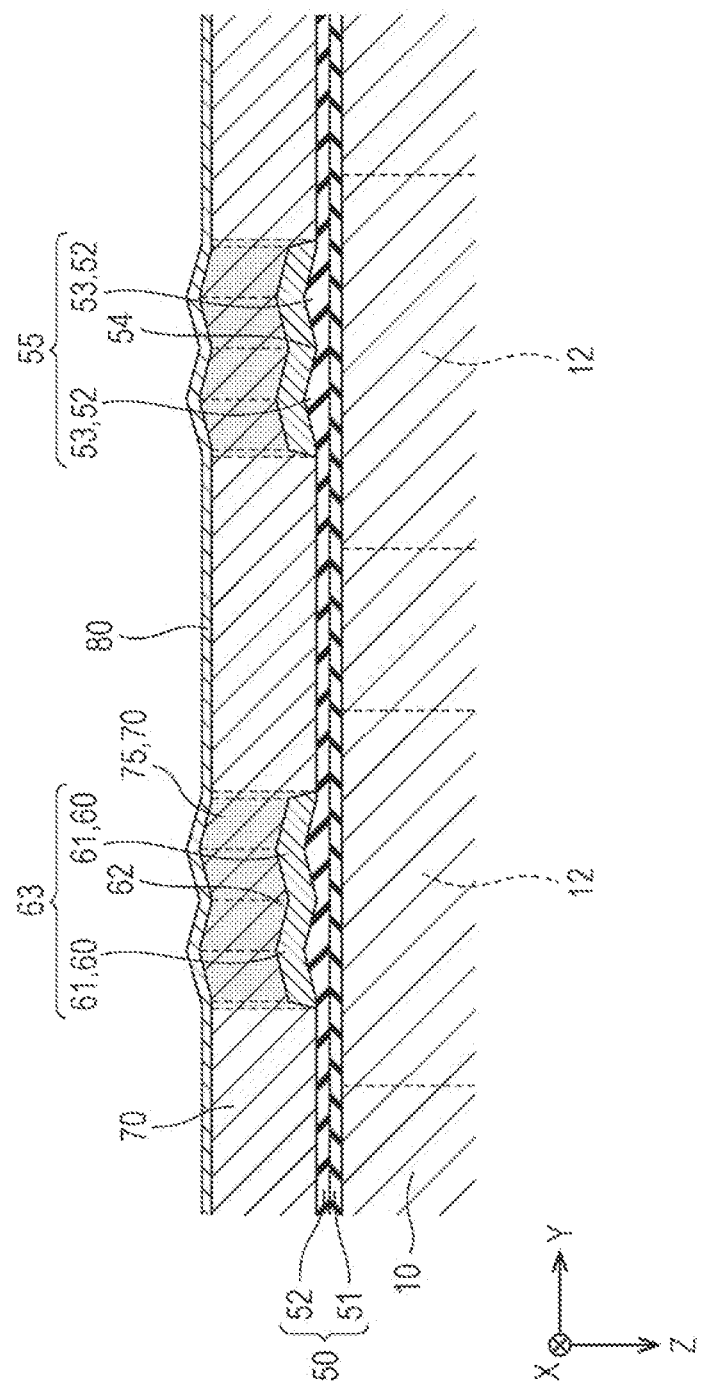
FIG. 9 is a sectional view illustrating a main portion of a piezoelectric actuator according to a second embodiment.

FIG. 9 is a sectional view of an ink jet recording head which is an example of a liquid ejecting head according to the second embodiment of the present disclosure, and is a sectional view corresponding to line IV-IV of FIG. 6. The same members as those in the first embodiment are designated by the same reference numerals, and redundant descriptions will be omitted.

The present embodiment is a modification example of the uneven portion 63 formed on the surface of the first electrode 60, and other configurations are the same as those of the first embodiment.

The present embodiment illustrates an example in which also on the surface of the base layer that is the base of the first electrode, the uneven portion constituted with the plurality of projection portions and the recess portion formed between the projection portions is provided. Specifically, as illustrated in FIG. 9, on the surface of the insulator film 52 which is the base layer of the first electrode 60, an uneven portion 55 constituted with two projection portions 53 and one recess portion 54 formed between the two projection portions 53 is provided on a portion corresponding to the uneven portion 63 of the first electrode 60.

The first electrode 60 is formed to have a substantially constant thickness on the insulator film 52 provided with the uneven portion 55 as described above, and as a result, the uneven portion 63 constituted with the two projection portions 61 and the one recess portion 62 is formed on the side of the piezoelectric body layer 70 of the first electrode 60.

As described above, in the present embodiment, also on the surface of the base layer that is the base of the first electrode at the end portion of the active portion, the uneven portion constituted with the plurality of projection portions and the recess portion formed between the projection portions is provided. Even in such a configuration, the piezoelectric body layer 70 formed on the uneven portion 63 has a lower orientation ratio than the piezoelectric body layer 70 formed on a portion other than the uneven portion 63 of the first electrode 60. Therefore, it is possible to suppress the occurrence of minute cracks in the piezoelectric body layer 70 due to bending deformation of the piezoelectric actuator 300 at the end portion of the active portion 310. Therefore, it is possible to suppress the occurrence of burnout due to the leak current caused by the minute cracks in the piezoelectric body layer 70. Further, since the first electrode 60 has a substantially constant thickness even in the uneven portion 63, it becomes easy to secure the function as the first electrode 60.

In the present embodiment, the uneven portion 55 is provided on the insulator film 52 as the base layer of the first electrode 60, but the uneven portion 55 may not necessarily be provided on the insulator film 52. For example, the uneven portion 55 may be provided on the elastic film 51, or may be provided on another film when the diaphragm 50 includes another film other than the elastic film 51 and the insulator film 52.

Third Embodiment

Figure 10:
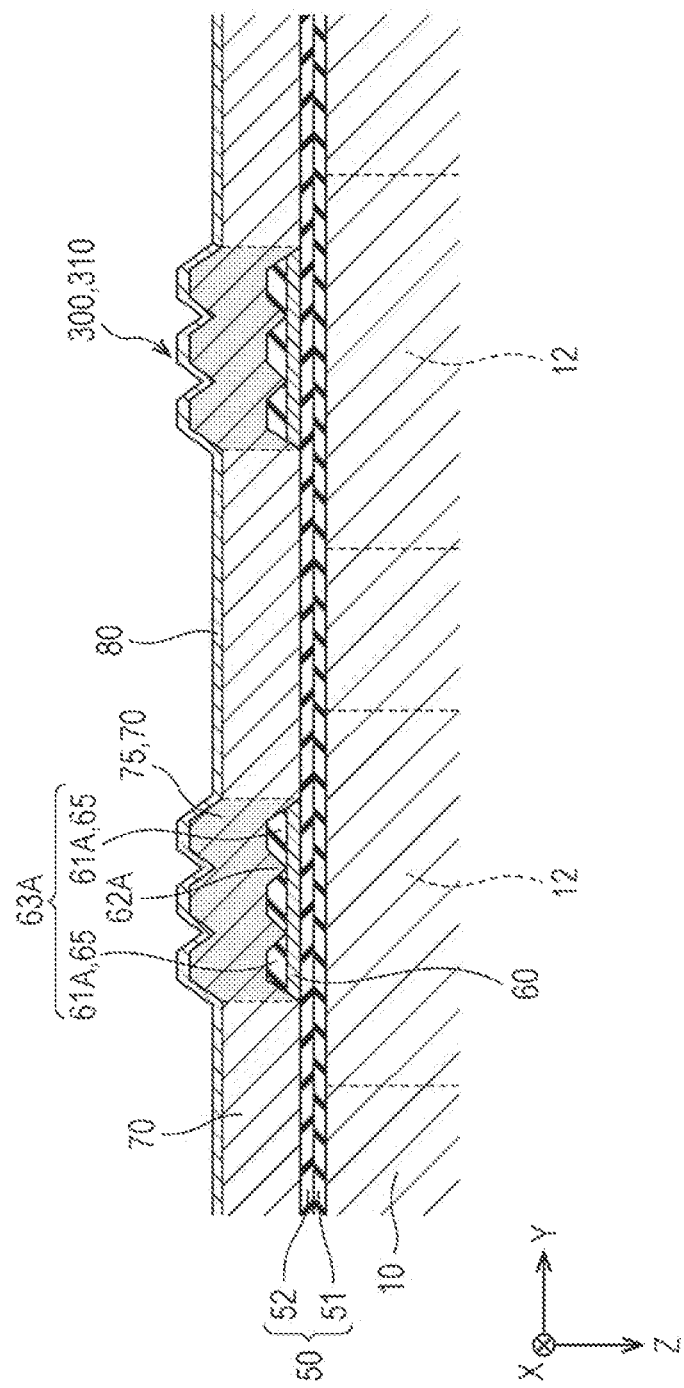
FIG. 10 is a sectional view illustrating a main portion of a piezoelectric actuator according to a third embodiment.

FIG. 10 is a sectional view illustrating a main portion of an ink jet recording head according to the third embodiment, and is a sectional view corresponding to line X-X of FIG. 6. The same members are designated by the same reference numerals, and redundant descriptions will be omitted.

The present embodiment is a modification example of the uneven portion 63 formed on the surface of the first electrode 60, and other configurations are the same as those of the first embodiment.

Specifically, as illustrated in FIG. 10, in the present embodiment, a projection portion 61A constituting an uneven portion 63A is formed of a material different from that of the first electrode 60. That is, the projection portion 61A is formed of an additional layer 65 made of a material different from that of the first electrode 60 formed on the side of the piezoelectric body layer 70 of the first electrode 60.

For example, the projection portion 61A is formed with a substantially trapezoidal cross section, and is formed in a linear shape along the pull-out direction of the first electrode 60 as in the embodiment described above. Each of recess portions 62A constituting the uneven portion 63A is formed to have a depth approximately similar to the thickness of the additional layer 65, but is formed without penetrating the additional layer 65 in the Z-axis direction. That is, the additional layer 65 is continuously provided even in the Y-axis direction. Therefore, the surface of the first electrode 60 is not exposed in the uneven portion 63 and is covered with the additional layer 65.

Since the projection portion 61A constituting the uneven portion 63A is formed of a material different from that of the first electrode 60, the orientation of the piezoelectric body layer 70 formed on the projection portion 61A is likely to be inhibited. Accordingly, similarly to the case of the first embodiment, the piezoelectric body layer 70 formed on the uneven portion 63A of the first electrode 60 has a lower orientation ratio than the piezoelectric body layer 70 formed on a portion other than the uneven portion 63A of the first electrode 60. Therefore, also in the present embodiment, it is possible to suppress the occurrence of minute cracks in the piezoelectric body layer 70 due to bending deformation at the end portion of the active portion 310. Therefore, it is possible to suppress the occurrence of burnout due to the leak current caused by the minute cracks in the piezoelectric body layer 70.

The material of the projection portion 61A may be a material different from that of the first electrode 60, but it is preferable that formation is made with a material that contributes less to the orientation of the piezoelectric body layer 70, that is, a material that easily inhibits the orientation of the piezoelectric body layer 70. In other words, it is preferable that the additional layer 65 functions as an orientation-inhibiting layer that inhibits the orientation of the piezoelectric body layer 70. Further, as the material of the projection portion 61A, it is preferable to use an insulating material that inhibits the orientation of the piezoelectric body layer 70, for example, aluminum oxide ($Al_2O_3$) or the like. As a result, the piezoelectric strain at the end portion of the active portion 310 can be suppressed to be appropriately small, and the occurrence of cracks or the like in the piezoelectric body layer 70 can be further suppressed easily.

The method of forming the uneven portion 63A is not particularly limited, and the uneven portion 63A can be formed by forming the additional layer 65 on the entire surface of the first electrode 60 and then patterning the additional layer 65. For example, by removing the portion of the additional layer 65 corresponding to the recess portion 62A by laser processing, the uneven portion 63A constituted with the projection portion 61A and the recess portion 62A can be relatively easily formed.

Other Embodiments

Although each embodiment of the present disclosure has been described above, the basic configuration of the present disclosure is not limited to the above.

For example, in the embodiment described above, the configuration in which each of the projection portions 61 is formed of only an inclined surface is illustrated, but each of the projection portions 61 may be configured to include a flat surface in a small amount substantially parallel to the surface 10a of the flow path forming substrate 10. In such a configuration, the influence may be smaller as compared with a case where the projection portion 61 is formed only on the inclined surface as described above, but the effect of suppressing the occurrence of burnout due to the leak current caused by the minute cracks in the piezoelectric body layer 70 can be expected compared with the configuration in related art.

For example, in each of the embodiments described above, the first electrode 60 may constitute an individual electrode for each active portion 310, and the second electrode 80 constitutes a common electrode of the plurality of active portions 310, but the first electrode 60 may constitute the common electrode of the plurality of active portions 310, and the second electrode 80 may constitute the individual electrode for each active portion 310. Even in this case, a similar effect as that of the embodiment described above can be obtained.

Figure 11:
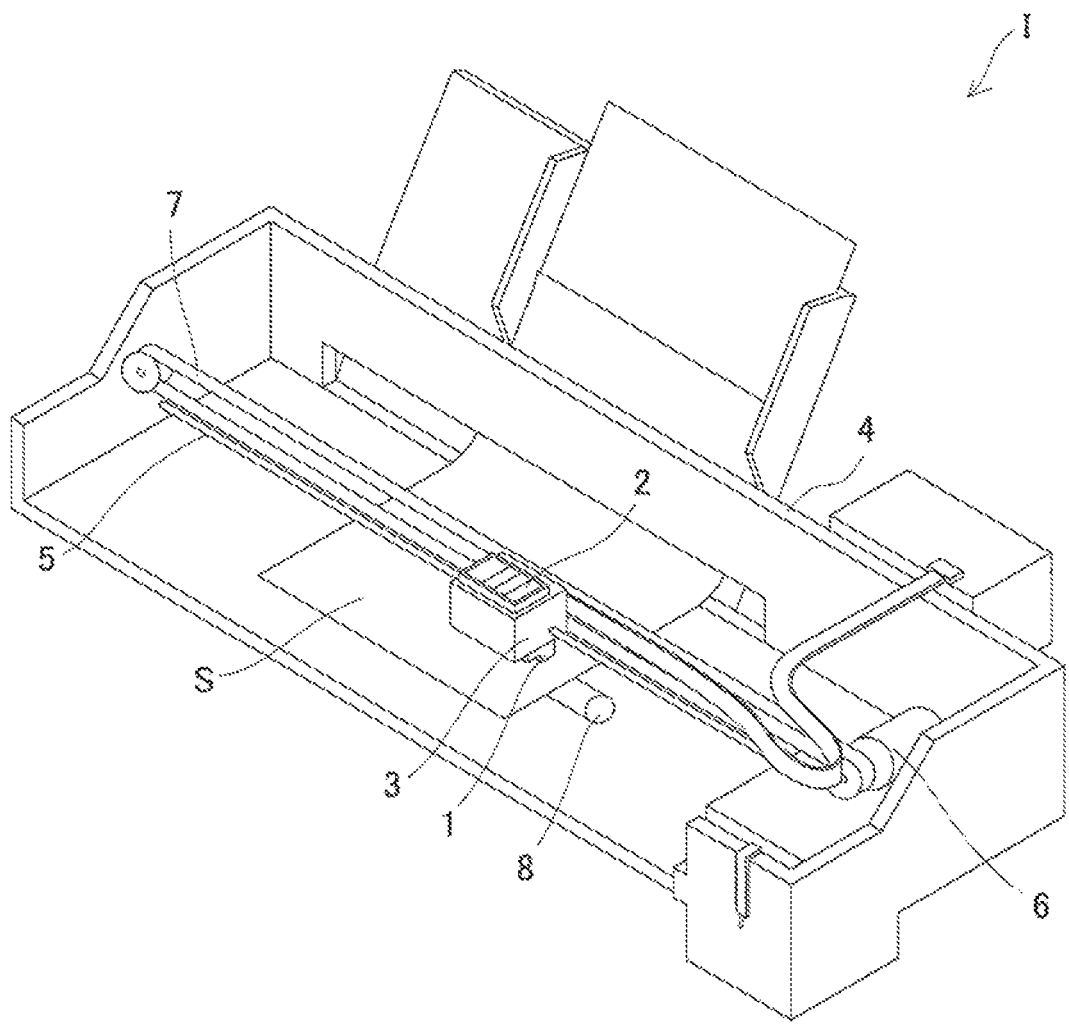
FIG. 11 is a diagram illustrating a schematic configuration of a recording apparatus according to an embodiment.

Further, the recording head 1 of each of these embodiments is mounted on an ink jet recording apparatus which is an example of a liquid ejecting apparatus. FIG. 11 is a schematic view illustrating an example of an ink jet recording apparatus which is an example of a liquid ejecting apparatus according to an embodiment.

In an ink jet recording apparatus I illustrated in FIG. 11, the recording head 1 is provided with a detachable cartridge 2 constituting an ink supply unit, and is mounted on a carriage 3. The carriage 3 on which the recording head 1 is mounted is provided to be movable in the axial direction of a carriage shaft 5 attached to an apparatus main body 4.

Then, the driving force of a drive motor 6 is transmitted to the carriage 3 via a plurality of gears (not illustrated) and a timing belt 7, so that the carriage 3 mounted with the recording head 1 is moved along the carriage shaft 5. On the other hand, the apparatus main body 4 is provided with a transport roller 8 as a transport unit, and a recording sheet S, which is a recording medium such as paper, is transported by the transport roller 8. The transport unit for transporting the recording sheet S is not limited to the transport roller, and may be a belt, a drum, or the like.

In such ink jet recording apparatus I, when the recording sheet S is transported in the X-axis direction with respect to the recording head 1, and the carriage 3 is reciprocated in the Y-axis direction with respect to the recording sheet S, by ejecting ink droplets from the recording head 1 in the meantime, the landing of ink droplets, so-called printing is performed over substantially the entire surface of the recording sheet S.

Further, in the embodiment described above, as the ink jet recording apparatus I, an example in which the recording head 1 is mounted on the carriage 3 and reciprocates in the X-axis direction which is the main scanning direction is illustrated, but the configuration of the ink jet recording head I is not limited thereto. The ink jet recording apparatus I may be, for example, a so-called line recording apparatus in which the recording head 1 is fixed and printing is performed only by moving the recording sheet S such as paper in the Y-axis direction which is a sub scanning direction.

In the above embodiment, an ink jet recording head has been described as an example of the liquid ejecting head, and an ink jet recording apparatus has been described as an example of the liquid ejecting apparatus, but the present disclosure is intended for a wide range of liquid ejecting heads and liquid ejecting apparatuses in general, and of course, can be also applied to a liquid ejecting head and a liquid ejecting apparatus that eject a liquid other than ink. Other liquid ejecting heads include, for example, various recording heads used in an image recording apparatus such as a printer, a color material ejecting head used in manufacturing a color filter such as a liquid crystal display, an electrode material ejecting head used for forming an electrode such as an organic EL display and a field emission display (FED), a bioorganic substance ejecting head used for manufacturing a biochip, or the like, and the present disclosure can also be applied to a liquid ejecting apparatus provided with such a liquid ejecting head.

Further, the present disclosure can be applied not only to a liquid ejecting head typified by an ink jet recording head, but also to other piezoelectric devices such as an ultrasonic device such as an ultrasonic transmitter, an ultrasonic motor, a pressure sensor, and a pyroelectric sensor.

What is claimed is:

1. A piezoelectric device comprising:
a diaphragm provided on a side of one surface of a substrate; and a piezoelectric actuator having a first electrode, a piezoelectric body layer, and a second electrode which are stacked on a side of a surface opposite to the substrate of the diaphragm, wherein
the piezoelectric actuator includes an active portion in which the piezoelectric body layer is pinched between the first electrode and the second electrode, and has an uneven portion constituted with a plurality of projection portions and a recess portion formed between the projection portions on a surface of the first electrode on a side of the piezoelectric body layer at an end portion of the active portion.

2. The piezoelectric device according to claim 1, wherein the projection portion and the recess portion are provided in a linear shape along a pull-out direction of the first electrode.

3. The piezoelectric device according to claim 1, wherein the uneven portion is formed of the same metal material as the first electrode.

4. The piezoelectric device according to claim 3, wherein the recess portion is provided to penetrate the first electrode in a thickness direction.

5. The piezoelectric device according to claim 1, wherein the uneven portion is formed of a different material from the first electrode.

6. The piezoelectric device according to claim 1, wherein the uneven portion is continuously provided from the active portion to an inactive portion.

7. The piezoelectric device according to claim 1, wherein the uneven portion constituted with the plurality of projection portions and the recess portion formed between the projection portions is provided also on a surface of a base layer that is a base of the first electrode at the end portion of the active portion.

8. The piezoelectric device according to claim 1, wherein the first electrode is an individual electrode that is independent for each of the piezoelectric actuators, and the second electrode is a common electrode common to a plurality of the piezoelectric actuators.

9. A liquid ejecting head comprising the piezoelectric device according to claim 1.

10. A liquid ejecting apparatus mounted with the liquid ejecting head according to claim 9.

* * * * *